(12) United States Patent
Vernenker et al.

(10) Patent No.: US 7,149,129 B2
(45) Date of Patent: Dec. 12, 2006

(54) MEMORY OUTPUT DATA SYSTEMS AND METHODS WITH FEEDBACK

(75) Inventors: Hemanshu T. Vernenker, Austin, TX (US); Margaret C. Tait, Austin, TX (US); Christopher Hume, Austin, TX (US); Allen White, Austin, TX (US); Tim Swensen, Mountain View, CA (US); Sam Tsai, Milpitas, CA (US); Steve Eplett, Fremont, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 87 days.

(21) Appl. No.: 10/973,750

(22) Filed: Oct. 25, 2004

(65) Prior Publication Data

US 2006/0087897 A1    Apr. 27, 2006

(51) Int. Cl.
*G11C 7/10*    (2006.01)

(52) U.S. Cl. ............................ 365/189.05; 365/189.02; 365/230.06

(58) Field of Classification Search ............ 365/189.05, 365/189.02, 194, 230.02, 230.03, 230.06
See application file for complete search history.

(56) References Cited

U.S. PATENT DOCUMENTS

| | | | | |
|---|---|---|---|---|
| 5,553,170 A | * | 9/1996 | Kumagai | ............... 382/283 |
| 5,987,601 A | * | 11/1999 | Donovan | ............... 712/244 |
| 6,020,904 A | * | 2/2000 | Clark | ............... 345/554 |

* cited by examiner

*Primary Examiner*—Gene N. Auduong
(74) *Attorney, Agent, or Firm*—MacPherson Kwok Chen & Heid LLP; Greg J. Michelson

(57) ABSTRACT

Systems and methods provide output data from a memory. For example, in accordance with an embodiment of the present invention, techniques are disclosed for providing glitch-free output data from a memory through feedback of the output data signal.

20 Claims, 6 Drawing Sheets

MEMORY OUTPUT DATA SYSTEMS AND METHODS WITH FEEDBACK

TECHNICAL FIELD

The present invention relates generally to electrical circuits and, more particularly, to memory and output data from a memory.

BACKGROUND

In a memory (e.g., an embedded memory) where output data is not registered, the last stage in an output data path is typically a column data multiplexer, which selects from among a number of column data signals based on the column address. One potential drawback with the column addresses, which are the control signals to the column data multiplexer, is that the column addresses could arrive at the column data multiplexer before the column data signals. This may occur because the column data signals, which travel through the memory core, may have a slower path relative to the column addresses. Consequently, this may result in a glitch on the output data signal due to the column data multiplexer switching from one column to a second column before new valid output data arrives at the second column. Therefore, for a brief period, old invalid output data is read out from the second column.

A conventional approach to this problem is to delay the column address to the column data multiplexer so that the column addresses arrive at the column data multiplexer after the valid output data from the memory core. For example, one approach is to insert a delay (e.g., a delay chain) in the column address path so that the column addresses arrive at the column data multiplexer after the output data. However, it may be difficult to match the output data path with the column address path. Generally, some margin is required between the column address signal and the output data signal to ensure that no glitch occurs in the output data signal. Consequently, the access time generally increases by the margin required for a glitch-free design, with the critical path becoming the column address path rather than the data path from the memory. However, the margin required may vary substantially with process variations and the location of the data in the memory.

As another example, a second approach is to provide a data path circuit (e.g., a dummy data path) to generate the column address signals to match the column address delay and the output data delay to the column data multiplexer. However, this approach may add significantly to die area overhead and design complexity. As a result, there is a need for improved memory techniques for providing the output data.

SUMMARY

Systems and methods are disclosed herein to provide output data from a memory. For example, in accordance with an embodiment of the present invention, a system and a method for providing glitch-free output data from a memory is disclosed. The output data from an output data cycle is fed back to all of the output memory latches. When the next column address arrives, the output data provided will be the same output data as the previous cycle until the valid output data for the current cycle arrives. Furthermore, the system and method may provide a race-free method for generating glitch-free output data from the memory.

More specifically, in accordance with one embodiment of the present invention, an integrated circuit includes a memory array having a plurality of memory cells; output latches adapted to receive data from the memory array; and an output multiplexer adapted to receive the data from the output latches and provide an output data signal, wherein the output latches are further adapted to receive the output data signal from the output multiplexer.

In accordance with another embodiment of the present invention, an integrated circuit includes a memory; a read circuit adapted to read data stored in the memory; and an output multiplexer adapted to receive the data from the read circuit, wherein the output multiplexer provides an output data signal that provides the data back to the read circuit.

In accordance with another embodiment of the present invention, a method of providing data from a memory includes reading data stored in the memory; latching the data; selecting from the latched data to provide an output data signal from the memory; and feeding back the latched data provided on the output data signal.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
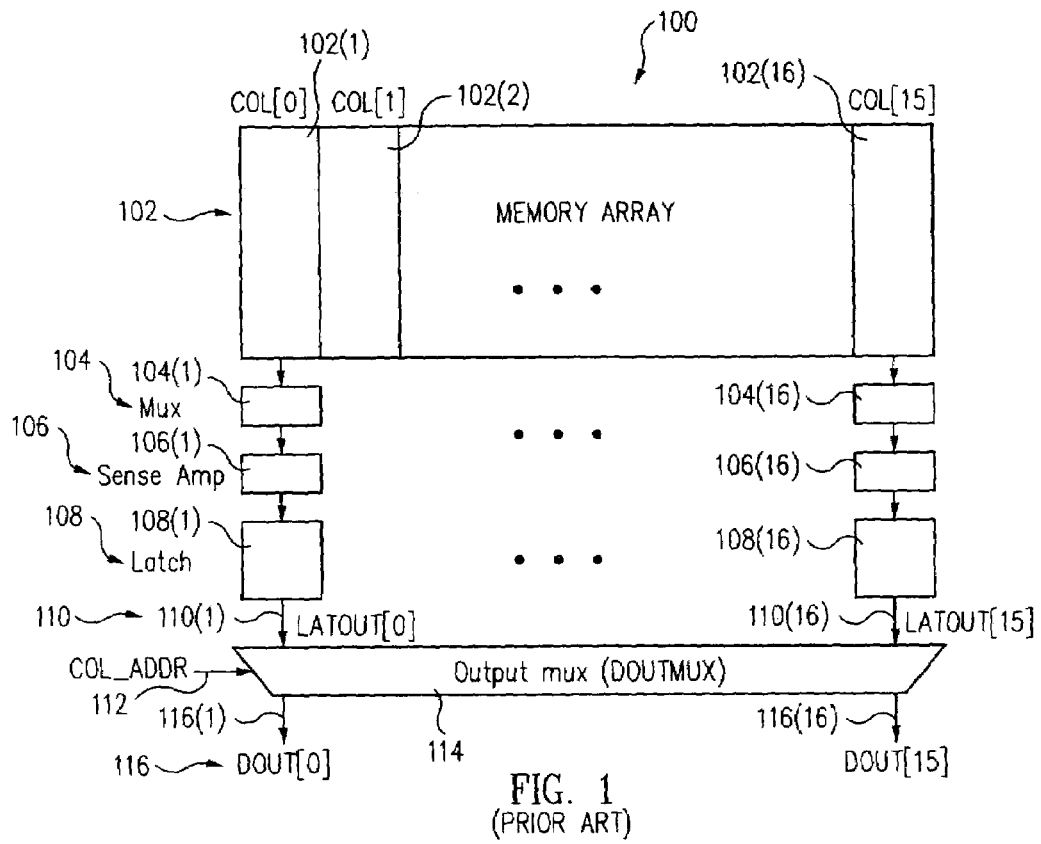
FIG. 1 shows a block diagram illustrating a conventional memory.

FIG. 1 shows a block diagram illustrating a memory 100. Memory 100 is an exemplary memory implementation, which may represent a static random access memory (SRAM) that is configurable (e.g., width-configurable flow-through memory). However, the techniques disclosed herein are not limited to any one type of memory and may be applied or extended to various types of memories having different sizes and configurations.

Memory 100 includes a memory array 102, with memory array 102 having sixteen columns (labeled COL[0] through COL[15]) that are separately referenced as memory array 102(1) through 102(16). Memory array 102 has a data width of sixteen bits in its widest configuration and, therefore, memory 100 provides sixteen output data signals 116 (separately referenced as output data signal 116(1) through 116 (16) and labeled DOUT[0] through DOUT[15] or DOUT [15:0]). As an exemplary implementation for this example, memory array 102 is assumed to store 16,384 bits and be configured as a 16,384 by 1 memory (or referred to herein as the 16 K by 1 configuration).

Memory array 102(1) through 102(16) has corresponding read circuitry, which includes bitline column multiplexers 104 (separately referenced as bitline column multiplexer 104(1) through 104(16)), sense amplifiers 106 (separately referenced as sense amplifier 106(1) through 106(16)), and output latches 108 (separately referenced as output latch 108(1) through 108(16). In the 16 k by 1 configuration, data stored in memory array 102 is read out from only one particular column (i.e., one of memory array 102(1) through 102(16)). The data propagates to the corresponding output latch 108 (i.e., the corresponding one of output latch 108(1) through 108(16)) for that column.

Output latches 108 provide a latch out signal 110 (separately referenced as latch out signal 110(1) through 110(16) and labeled LATOUT[0] through LATOUT[15]) to an output multiplexer 114 (DOUTMUX), which multiplexes latch out signal 110 (LATOUT[15:0]). Output multiplexer 114 provides output data signal 116, depending upon the selected memory configuration (e.g., 16 K by 1, 8 k by 2, 4 k by 4, 2 k by 8, or 1 k by 16) and based on a value of a column address signal 112 (labeled COL_ADDR or ADDR_COL and also referred to as a multiplexer control signal), which provides the column address bits (e.g., coded or decoded).

Figure 2:
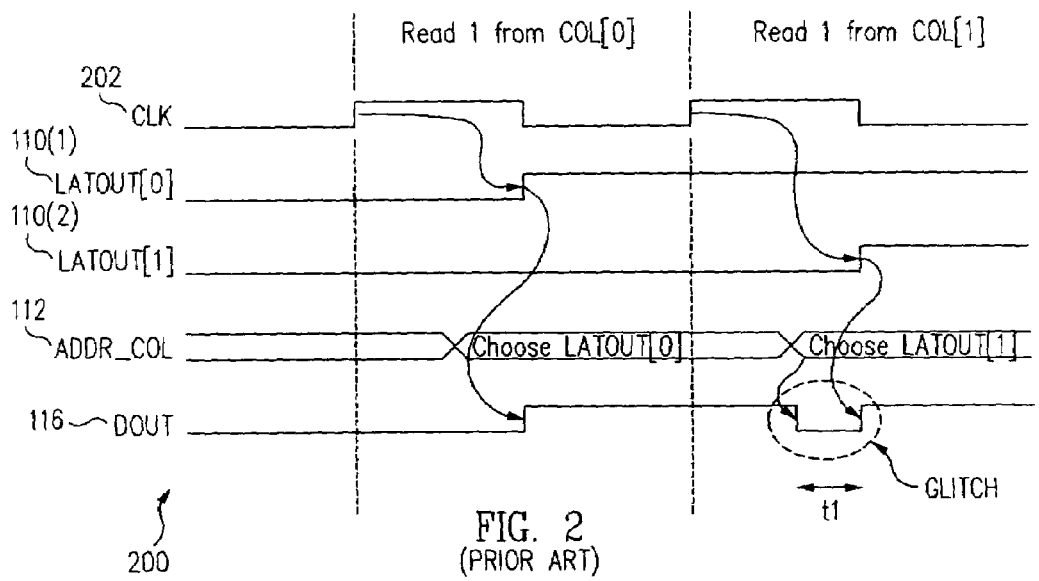
FIG. 2 shows a timing diagram for the memory of FIG. 1.

FIG. 2 shows a timing diagram 200 for memory 100 of FIG. 1. Timing diagram 200 illustrates exemplary waveforms for a clock (CLK) signal 202, latch out signals 110(1) and 110(2), column address signal 112, and output data signal 116 and provides an example of a glitch occurring on output data signal 116.

During a first read cycle (labeled Read 1 from COL[0]), data from memory array 102(1) (column 0) is read out onto latch out signal 110(1), while during a second read cycle (labeled Read 1 from COL[1]), data from memory array 102(2) (column 1) is read out onto latch out signal 110(2). For this example, column address signal 112 arrives prior to the data on latch out signal 110(2) (e.g., during the time period identified in FIG. 2 as time t1). Consequently, a glitch occurs on output data signal 116 during the second read cycle, when the column address bits change on column address signal 112, because for the time duration t1, stale data from latch out signal 110(2) was driven through output multiplexer 114 until latch out signal 110(2) received the new data and switched to its valid state.

Figure 3:
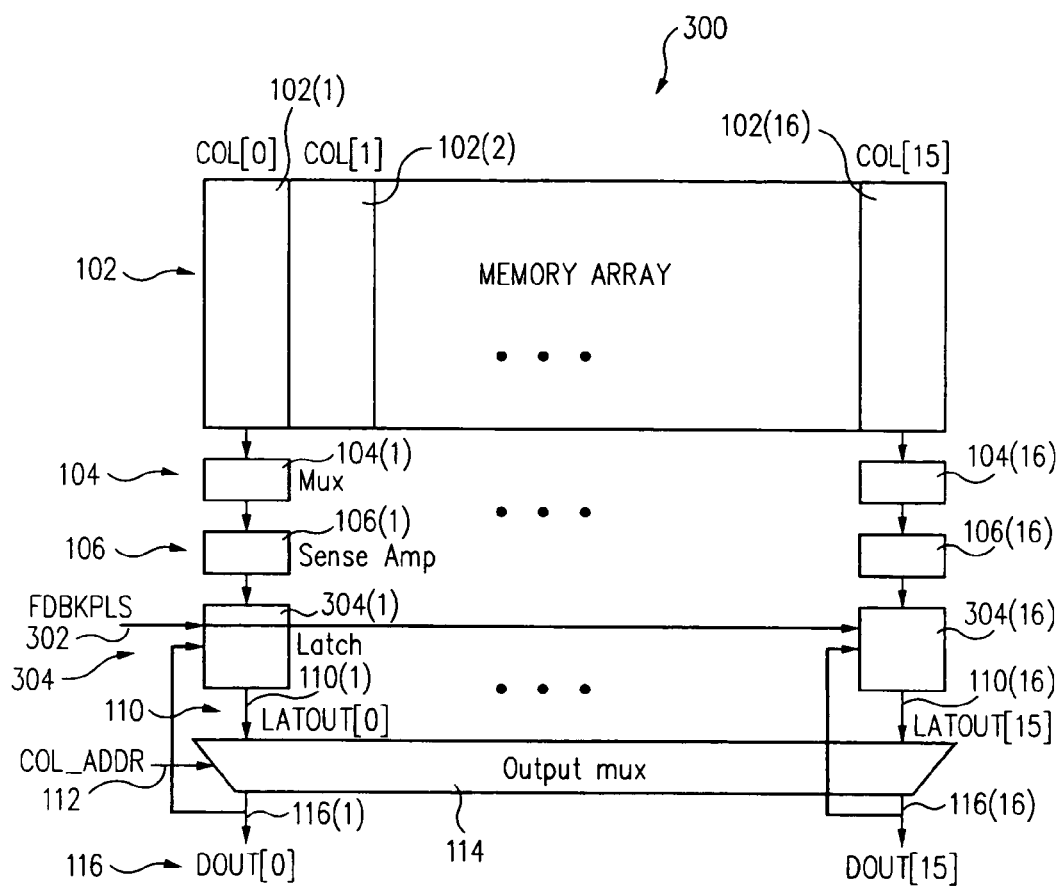
FIG. 3 shows a block diagram illustrating a memory in accordance with an embodiment of the present invention.

FIG. 3 shows a block diagram illustrating a memory 300 in accordance with an embodiment of the present invention. Memory 300 is similar to memory 100 (FIG. 1), but includes techniques to reduce or eliminate glitches on output data signal 116, such as the exemplary glitch in FIG. 2.

As illustrated in FIG. 3, output data signal 116 is fed back to output latches 304 (separately referenced as output latch 304(1) through 304(16)), which are similar to output latches 108 but are modified to also accept output data signal 116. Output data signal 116 is provided on latch out signal 110 when a feedback signal 302 (e.g., a pulse and labeled FDBKPLS or referred to as a latch control signal) is asserted and received by output latches 304. For example, feedback signal 302 may be generated early in a read cycle based on a positive edge of a clock signal (e.g., clock signal 202).

Depending upon the memory configuration of memory 300 (e.g., 16 k by 1 or 4 k by 4), latch out signal 110 is provided on all of output data signals 116(1) through 116 (16). For example, in the 16 k by 1 configuration, because only one of latch out signals 110(1) through 110(16) is selected for a given read operation, that particular latch out signal 110 is driven onto (i.e., fans out to) all sixteen output data signals 116 (i.e., output data signals 116(1) through 116(16)) by output multiplexer 114. As another example, in the 4 k by 4 configuration, because only four of latch out signals 110(1) through 110(16) are selected for a given read operation, those four particular latch out signals 110 (e.g., latch out signal 110(1) through 110(4)) are driven onto all sixteen output data signals 116 by output multiplexer 114 (e.g., latch out signals 110(1) through 110(4) are provided on output data signals 116(1) through 116(4), 116(5) through 116(8), 116(9) through 116(12), and 116(13) through 116 (16)).

Figure 4:
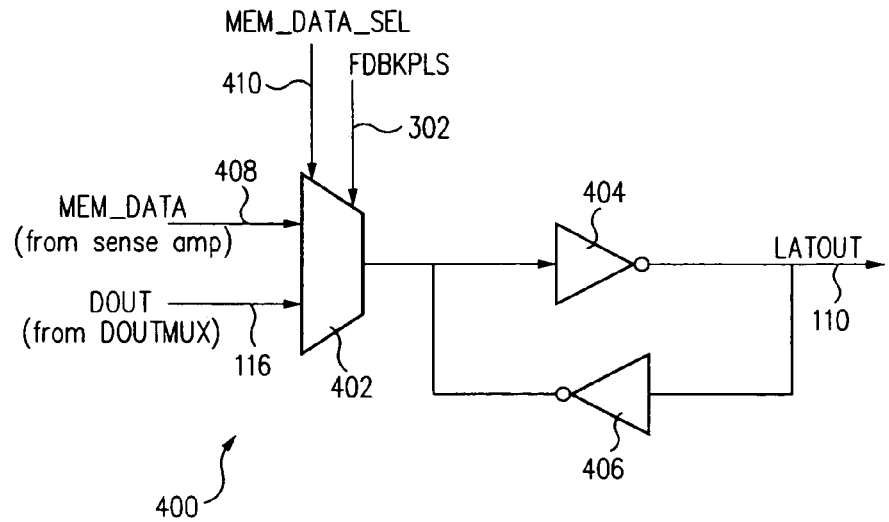
FIG. 4 shows a circuit diagram illustrating an exemplary implementation for a portion of the memory of FIG. 3 in accordance with an embodiment of the present invention.

FIG. 4 shows a circuit 400, illustrating an exemplary circuit implementation for one of output latches 304 of memory 300 of FIG. 3 in accordance with an embodiment of the present invention. Circuit 400 includes a multiplexer 402 and inverters 404 and 406, which form a latch to provide latch out signal 110 (e.g., latch out signal 110(1)).

Multiplexer 402 receives one of output data signals 116 fed back from output multiplexer 114 and a data signal 408 (labeled MEM_DATA), which is the data from memory array 102 provided by one of sense amplifiers 106. As an example, feedback signal 302 is asserted (e.g., fires) early in a read cycle to control multiplexer 402 to provide output data signal 116 from the previous read cycle as latch out signal 110. Later in the read cycle, valid data is provided on data signal 408, which is then provided by multiplexer 402 as latch out signal 110 under control of a control signal 410 (labeled MEM_DATA_SEL).

Control signal 410 selects data signal 408 when the data from sense amplifiers 106 is ready to be latched. Alternatively, for example in accordance with an embodiment of the present invention, circuit 400 may be replaced by an exemplary circuit implementation of a set/reset flip flop, with control signal 410 being the inverse of feedback signal 302.

Figure 5:
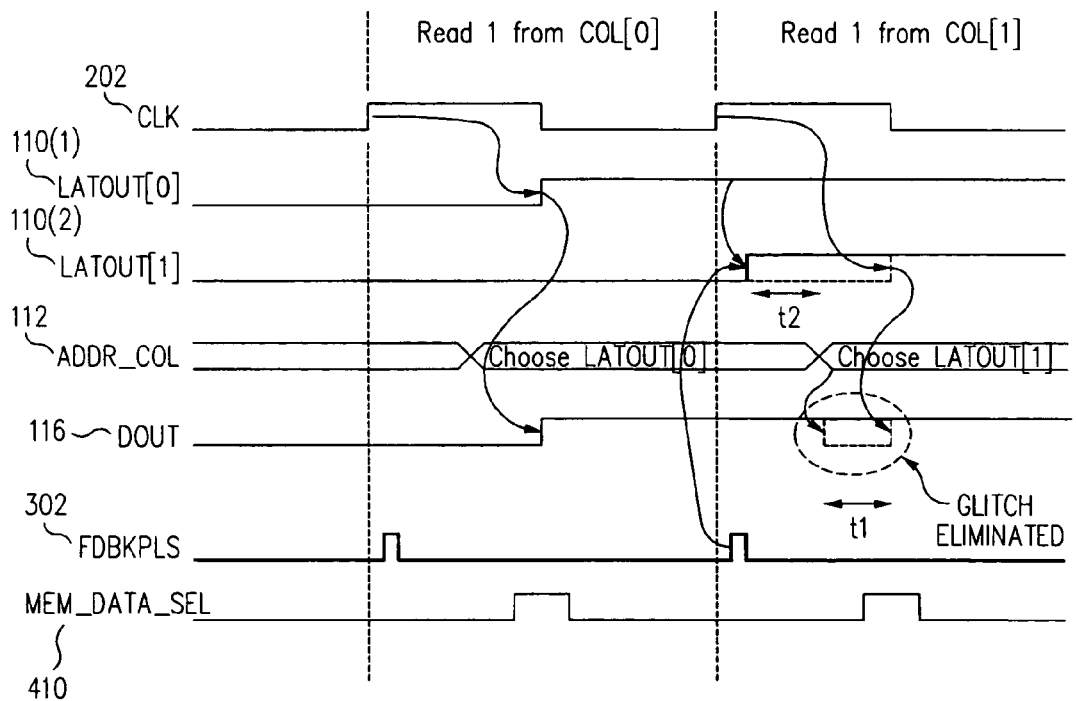
FIG. 5 shows a timing diagram for the memory of FIG. 3 in accordance with an embodiment of the present invention.

FIG. 5 shows a timing diagram 500 for memory 300 of FIG. 3 in accordance with an embodiment of the present invention. Timing diagram 500 illustrates exemplary waveforms for clock (CLK) signal 202, latch out signals 110(1) and 110(2), column address signal 112, output data signal 116, feedback signal 302, and control signal 410. Timing diagram 500 provides an example of a potential glitch that is prevented from occurring on output data signal 116 (with the bold waveform portions on latch out signal 110(2) and output data signal 116 illustrating how the potential glitch is eliminated).

During a first read cycle, data from memory array 102(1) (column 0) is read out onto latch out signal 110(1) and is provided by output multiplexer 114 on output data signals 116(1) through 116(16). When feedback signal 302 is asserted during a second read cycle, latch out signal 110(2) is updated with the data from output data signal 116 (specifically output data signal 116(2)), which is the data from latch out signal 110(1) from the first read cycle.

As a result, even though column address signal 112 arrives prior to the new valid data on latch out signal 110(2), no glitch occurs on output data signal 116. Furthermore, because column address signal 112 is not delayed and the time period t1 is greater than zero, there is no degradation of performance. The critical path is still the data path from memory array 102.

In general for memory 300, output latches 304 must be updated and the data on latch out signal 110 propagated to output multiplexer 114 before column address signal 112 provides the new address bits (i.e., t2>0 as illustrated in FIG. 5). Consequently, a race condition may exist between latch out signal 110 (providing to output multiplexer 114 the data from output data signal 116) and column address signal 112 (providing the new address bits to output multiplexer 114).

This potential race condition may be solved by sufficiently delaying column address signal 112 until the data on output data signal 116 propagates through output latches 304 and reaches output multiplexer 114, with column address signal 112 arriving at output multiplexer 114 before the new data from memory array 102 arrives at output multiplexer 114. The proper delay may be determined, for example, through simulation of the feedback data path (the path of output data signal 116 to and through output latches 304) and the path of column address signal 112, with these timing considerations possibly process (e.g., process, voltage, and temperature (PVT)) dependent.

Figure 6:
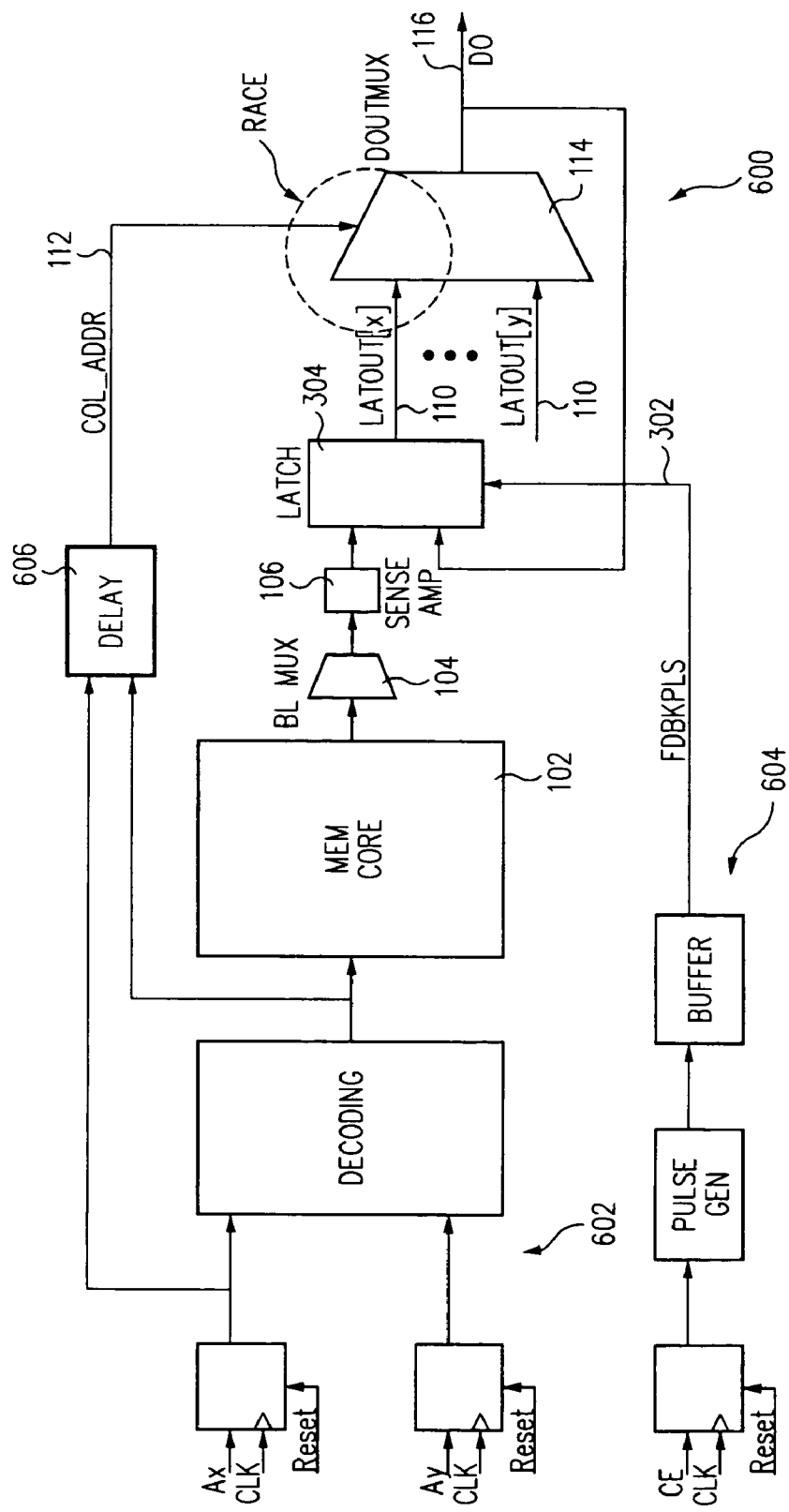
FIG. 6 shows a block diagram illustrating a circuit delay method for the memory of FIG. 3 in accordance with an embodiment of the present invention.

For example, FIG. 6 shows a block diagram of a memory 600, which implements a delay technique that may be applied to memory 300 of FIG. 3 in accordance with an embodiment of the present invention. Specifically, memory 600 is similar to memory 300, but illustrates an exemplary implementation of a delay 606 for column address signal 112. Delay 606 provides a sufficient delay to column address signal 112 to resolve a potential race condition between signals as illustrated in FIG. 6 and discussed herein. In general, memory 600 illustrates a delay method to minimize or possibly eliminate a potential race condition between column address signal 112 and the data on latch out signal 110 due to feedback signal 302.

Memory 600 also illustrates an exemplary implementation for generating feedback signal 302 and column address signal 112. For example, feedback signal 302 is generated via a circuit 604 having a buffer, a pulse generator, and a register (which receives a clock signal (CLK), a clock enable signal (CE), and a reset signal). Column address signal 112 is generated via a circuit 602 having an address decoder and registers (which receive address signals (e.g., Ax through Ay), the clock signal, and the reset signal).

In accordance with another embodiment of the present invention, the feedback data path (the path of output data signal 116 to and through output latches 304) may be matched with the address path of column address signal 112 to minimize or eliminate the potential race condition. This technique may operate across process corners (i.e., possibly no race condition regardless of PVT conditions) and provide proper functioning of the memory (e.g., t2>0).

Figure 7:
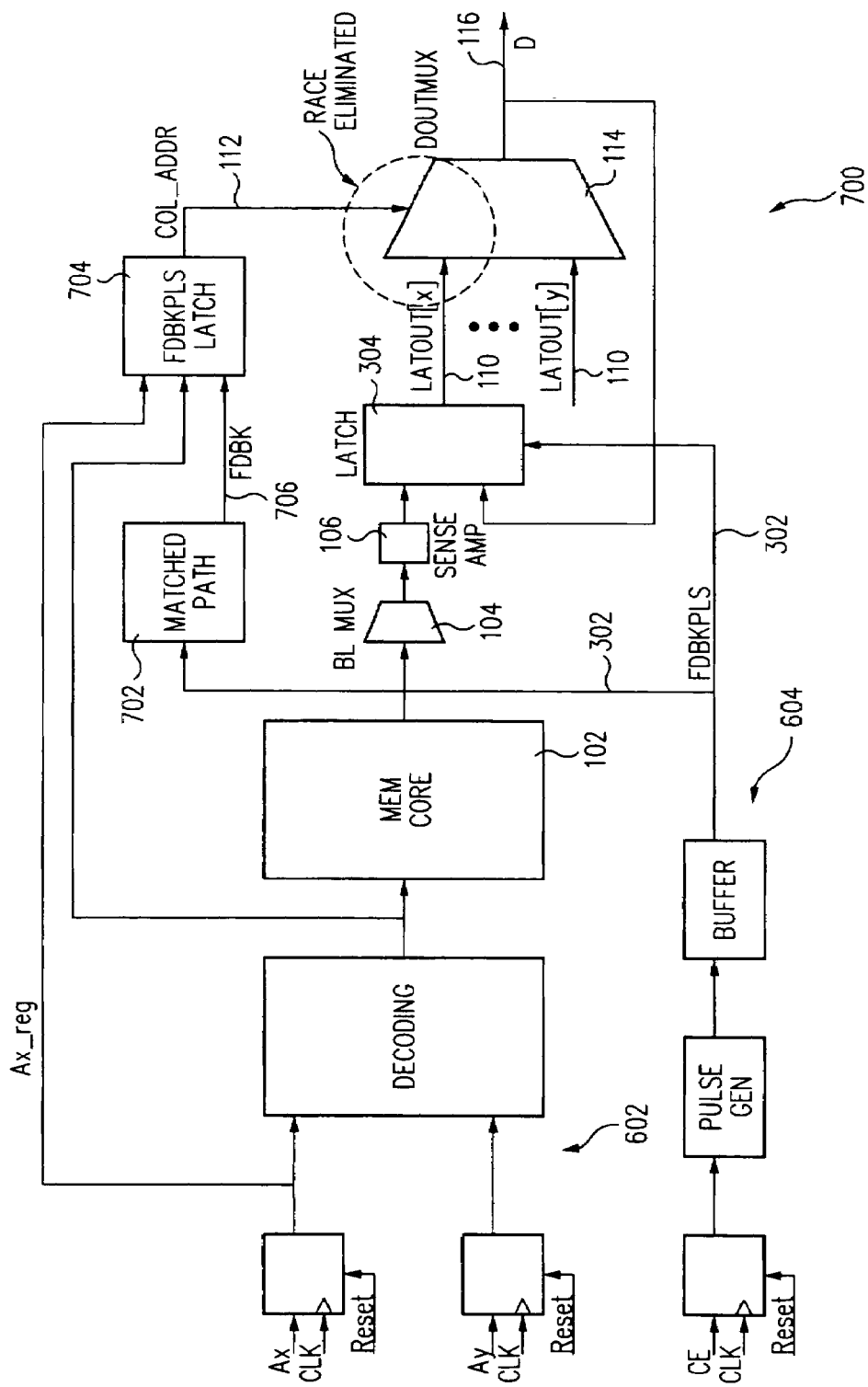
FIG. 7 shows a block diagram illustrating a matched circuit path method for the memory of FIG. 3 in accordance with an embodiment of the present invention.

For example, FIG. 7 shows a block diagram illustrating a memory 700, which implements a matched circuit path method that may be applied to memory 300 of FIG. 3 in accordance with an embodiment of the present invention. Specifically, memory 700 is similar to memory 300 (and memory 600 of FIG. 6), but illustrates an exemplary implementation of a matched path 702 and a feedback signal latch 704 for feedback signal 302 and column address signal 112 to minimize or eliminate any potential race condition as discussed herein.

Matched path 702 and feedback signal latch 704 are implemented to match the address path of column address signal 112 to the path of the data on latch out signal 110 from output data signal 116 (i.e., the data on latch out signal 110 due to feedback signal 302). Matched path 702 (e.g., a conventional dummy latch or dummy path) matches substantially a time delay of output latch 304. Consequently, a feedback signal 706 (FDBK) from matched path 702 approximately matches a timing of data on latch out signal 110 due to feedback signal 302.

Depending upon the design of output multiplexer 114, internal delays associated with output multiplexer 114 may also need to be taken into account. For example, if output multiplexer 114 is a multi-stage multiplexer circuit, delays associated with one or more of the stages within output multiplexer 114 may need to be considered for delay 606 of memory 600 (FIG. 6) or matched path 702 of memory 700 (FIG. 7).

Figure 8:
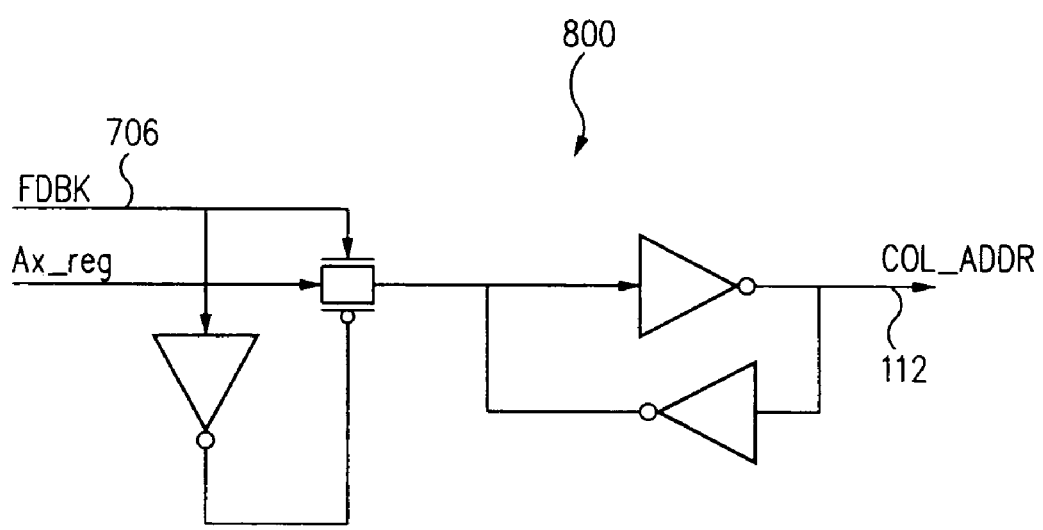
FIG. 8 shows a diagram illustrating a latch circuit for the memory of FIG. 7 in accordance with an embodiment of the present invention.

Feedback signal latch 704 ensures that column address signal 112 is asserted (e.g., fires) only after feedback signal 706 is asserted (e.g., transitions to a high logical state after the data on latch out signal 110 due to feedback signal 302 has propagated to output multiplexer 114). For example, FIG. 8 shows a circuit 800, illustrating an exemplary latch circuit implementation for feedback signal latch 704 of FIG. 7 in accordance with an embodiment of the present invention.

Circuit 800 helps to ensure that column address signal 112 is provided to output multiplexer 114 marginally after the data on latch out signal 110 arrives at output multiplexer 114 due to feedback signal 302. Consequently, the address path for column address signal 112 is generally guaranteed by design to be marginally slower (e.g., margin is approximately equal to the delay of the transmission gate plus the delay of the inverter in FIG. 8) than the feedback data path (for data from output data signal 116 to be fed back and propagated through output latches 304).

In accordance with one or more embodiments of the present invention, a novel feedback scheme is disclosed that does not require matching a column address path to the output data path through the memory core to the column multiplexer. The output data from a previous cycle is fed back to all of the output data memory latches (e.g., latched in all of the column latches very early in the current cycle). When the new column address arrives at the column multiplexer (prior to the new valid output data), the column multiplexer may select a different column depending on the value of the new column address. However, because all of the column latches have been updated with the previous output data, when the column multiplexer selects a different column, the output data still has the same value as the output data from the previous cycle until the current cycle's valid data arrives from the memory core.

In general, all of the column latches are updated and their outputs propagated to the column multiplexer prior to the arrival of the next column address. Depending upon the memory and the application, a race condition may exist that can be solved by delaying the column address until the output data is fed back and propagated to the column multiplexer prior to the arrival of the new valid output data. This solution may be process (e.g., PVT) dependent and may require simulation of the feedback output data path and the column address path. Alternatively, the column address path may be matched to the feedback output data path, which may operate across process corners (e.g., PVT conditions).

In both of these examples, the column address is delayed until the fed back data is propagated to the output multiplexer, but the column address still arrives at the output multiplexer before the new data from the sense amplifier is passed through the output latch and to the output multiplexer. Thus, the column address is bounded in that the column address must be delayed until the old output data is fed back, but must arrive before the new data has been latched in.

The techniques disclosed herein, in accordance with one or more embodiments of the present invention, provide improved output data techniques. One or more of the techniques may provide certain benefits over that of conventional approaches. For example, matching of the memory core output data path may not be required, memory may be implemented that is very robust across process corners (e.g., PVT conditions), and the column address signal does not have to be delayed relative to the output data with the access time for the output data not necessarily increased (e.g., minimal push out of the output data). Furthermore, memory may be implemented with a smaller die area than a memory with a full dummy data path scheme.

Embodiments described above illustrate but do not limit the invention. It should also be understood that numerous modifications and variations are possible in accordance with the principles of the present invention. Accordingly, the scope of the invention is defined only by the following claims.

We claim:

1. An integrated circuit comprising:
    a memory;
    a memory array, within the memory, having a plurality of memory cells;
    output latches, within the memory, adapted to receive data from the memory array; and
    an output multiplexer, within the memory, adapted to receive the data from the output latches and provide an output data signal from the memory, wherein the output latches are further adapted to receive the output data signal from the output multiplexer to selectively provide to the output multiplexer.

2. The integrated circuit of claim 1, wherein the output latches are controlled by a latch control signal, which determines whether the output latches provide the data received from the memory array or feedback data received from the output data signal.

3. The integrated circuit of claim 1, further comprising:
    bitline column multiplexers, coupled between the output latches and the memory array, adapted to receive the data from the memory array; and
    sense amplifiers, coupled between the bitline column multiplexers and the output latches, adapted to receive the data from the bitline column multiplexer and provide the data to the output latches.

4. The integrated circuit of claim 1, wherein the output multiplexer is controlled by a multiplexer control signal that controls a selection of the data from the output latches to provide as the output data signal.

5. The integrated circuit of claim 1, wherein a feedback control signal determines whether the output latches provide the data from the memory array or the data from the output data signal to the output multiplexer, the output multiplexer controlled by a multiplexer control signal that controls a selection of the data from the output latches to provide as the output data signal.

6. The integrated circuit of claim 5, further comprising a delay element adapted to delay the multiplexer control signal sufficiently to allow the data from the output data signal to be provided to the output multiplexer from the output latches.

7. The integrated circuit of claim 5, further comprising a matched path adapted to delay the multiplexer control signal and substantially match a time delay associated with the output latches for providing the data from the output data signal to the output multiplexer.

8. The integrated circuit of claim 5, further comprising:
    a matched path adapted to receive the feedback control signal and substantially match a time delay associated with the output latches for providing the data from the output data signal to the output multiplexer; and
    a latch, coupled to the matched path, for receiving the feedback control signal from the matched path and the multiplexer control signal and, based on a timing of the feedback control signal, providing the multiplexer control signal to the output multiplexer.

9. The integrated circuit of claim 8, wherein the multiplexer control signal arrives at the output multiplexer prior to the arrival of the data read from the memory array on a subsequent read cycle.

10. An integrated circuit comprising:
    a memory;
    a read circuit, within the memory, adapted to read data stored in the memory; and
    an output multiplexer, within the memory, adapted to receive the data from the read circuit, wherein the output multiplexer provides an output data signal from the memory and further provides the output data signal back to the read circuit.

11. The integrated circuit of claim 10, wherein the read circuit is adapted to receive a feedback control signal, which determines whether the read circuit provides the data read from the memory or the data provided by the output data signal, and the output multiplexer is adapted to receive a control signal for selecting the data from the read circuit.

12. The integrated circuit of claim 11, wherein a timing of the control signal is maintained so that the data from the output data signal is provided to the output multiplexer from the read circuit before the control signal reaches the output multiplexer.

13. The integrated circuit of claim 11, further comprising a delay element adapted to delay the control signal until the data from the output data signal is provided to the output multiplexer from the read circuit.

14. The integrated circuit of claim 11, further comprising a latch adapted to delay the control signal until the data from the output data signal is provided to the output multiplexer from the read circuit.

15. The integrated circuit of claim 11, wherein the memory is configurable.

16. A method of providing data from a memory, the method comprising;
    reading data stored in the memory;
    latching the data within the memory;
    selecting from the latched data to provide an output data signal from the memory; and
    feeding back, within the memory, the latched data provided on the output data signal for the latching.

17. The method of claim 16, wherein the latched data fed back on the output data signal is provided on the output data signal prior to a subsequent read of the memory.

18. The method of claim 16, wherein the memory is configurable.

19. The method of claim 16, wherein the output data signal is glitch free.

20. The method of claim 16, further comprising delaying the selecting to allow the latched data to be fed back.

* * * * *